US009065007B2

(12) United States Patent
Menezo

(10) Patent No.: US 9,065,007 B2
(45) Date of Patent: Jun. 23, 2015

(54) PROCESS FOR FABRICATING A RIDGE PIN JUNCTION COMPRISING SPACED APART DOPED REGIONS, APPLICATION TO THE FABRICATION OF ELECTRO-OPTICAL MODULATORS AND PHOTODETECTORS

(71) Applicant: COMMISSARIAT A L'ENERGIE ATOMIQUE ET AUX ENERGIES ALTERNATIVES, Paris (FR)

(72) Inventor: Sylvie Menezo, Voiron (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/468,729

(22) Filed: Aug. 26, 2014

(65) Prior Publication Data
US 2015/0056740 A1 Feb. 26, 2015

(30) Foreign Application Priority Data
Aug. 26, 2013 (FR) ..................................... 13 58170

(51) Int. Cl.
H01L 21/00 (2006.01)
H01L 31/18 (2006.01)
H01L 31/0232 (2014.01)

(52) U.S. Cl.
CPC ........ *H01L 31/186* (2013.01); *H01L 31/02327* (2013.01)

(58) Field of Classification Search
None
See application file for complete search history.

(56) References Cited

U.S. PATENT DOCUMENTS

| 2002/0054724 | A1* | 5/2002 | Tada et al. ........................ 385/2 |
| 2005/0123227 | A1 | 6/2005 | Vonsovici et al. ................ 385/2 |
| 2006/0215949 | A1 | 9/2006 | Lipson et al. ..................... 385/2 |
| 2010/0060970 | A1* | 3/2010 | Chen ............................. 359/245 |
| 2011/0180795 | A1* | 7/2011 | Lo et al. .......................... 257/51 |
| 2011/0311178 | A1* | 12/2011 | Fujikata et al. .................. 385/2 |
| 2012/0070111 | A1* | 3/2012 | Shin et al. ........................ 385/2 |
| 2013/0188902 | A1* | 7/2013 | Gardes et al. .................... 385/2 |
| 2014/0307300 | A1* | 10/2014 | Yang et al. .................... 359/245 |
| 2015/0011040 | A1* | 1/2015 | Green et al. .................... 438/69 |

OTHER PUBLICATIONS

Xu Qianfan, et al., "Micrometre-scale Silicon Electro-optic Modulator," Nature, vol. 435, No. 7040. pp. 325-327. May 19, 2005.
Wang, J., et al, "Evanescent-coupled Ge p-i-n Photodetectors on Si-Waveguide with SEG-Ge and Comparative Study of Lateral and Vertical p-i-n Configurations," IEEE Electron Device Letters, vol. 29 No. 5. pp. 445-448. May 1, 2008.

(Continued)

*Primary Examiner* — Asok K Sarkar
(74) *Attorney, Agent, or Firm* — Norton Rose Fulbright US LLP

(57) ABSTRACT

The invention relates to a process for fabricating a semiconductor ridge pin junction (20, 21). According to the invention, judicious choices are made when defining hard masks and the sequence in which resist masks are formed for implantation (doping) and etching, which choices enable the conventional photolithography technique to be used despite the low precision of mask alignment (±100 nm) relative to underlying regions.
By virtue of the process according to the invention, a ridge pin junction is formed, at lower cost and with shorter production times than in the prior art, with doped regions precisely spaced apart from the edge of the ridge.

9 Claims, 10 Drawing Sheets

(56) References Cited

OTHER PUBLICATIONS

Laurent Vivien, et al., "Zero-bias 40Gbit/s Germanium Waveguide Photodetector on Silicon References and Links," IEEE Photonics Technology Lett. Phys. Journal of Electrochemistry. pp. 10317-10325. Jan. 4, 2012.

Tsung-Yang Liow, et al., "Silicon Modulators and Germanium Photodetectors on SOI: Monolithic Integration, Compatibility, and Performance Optimization," IEEE Journal of Selected Topics in Quantum Electronics, vol. 16, No. 1. Jan. 1, 2010.

* cited by examiner

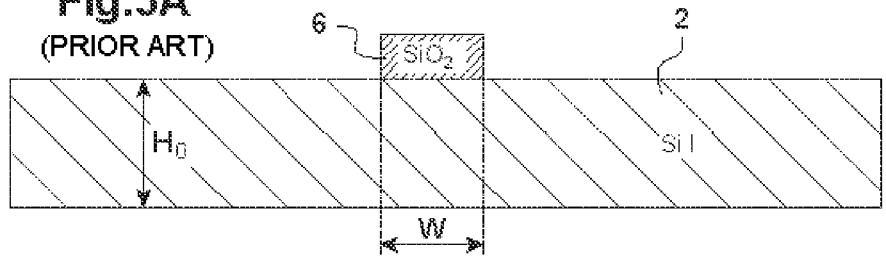
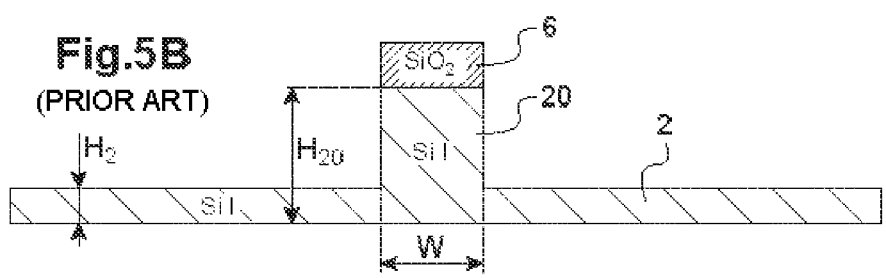
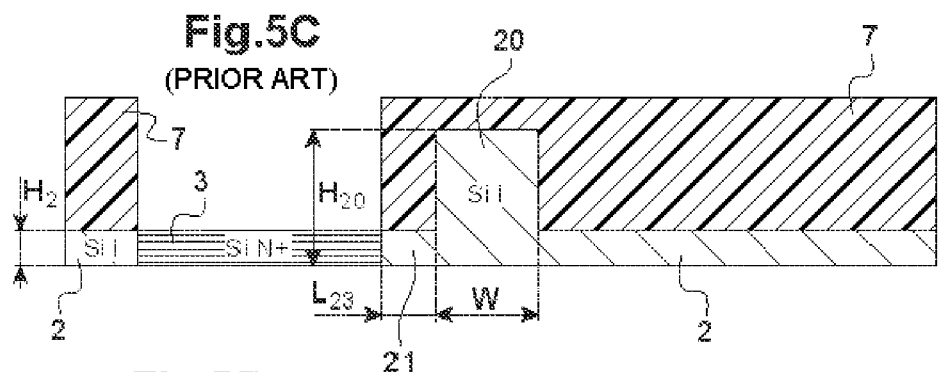
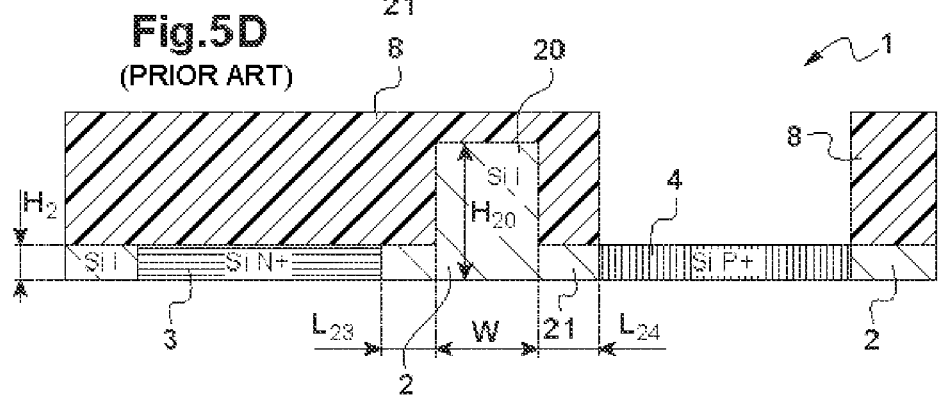
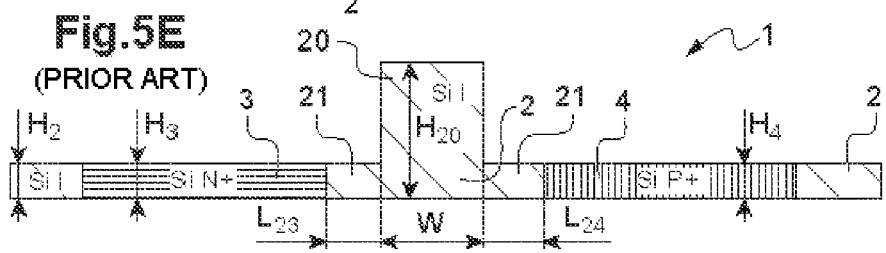

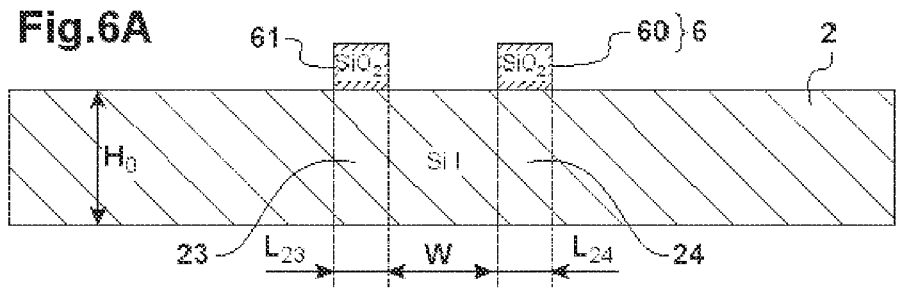
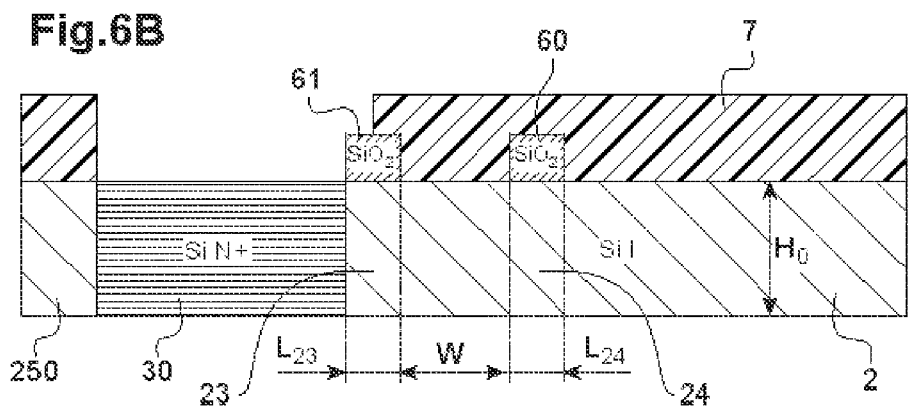
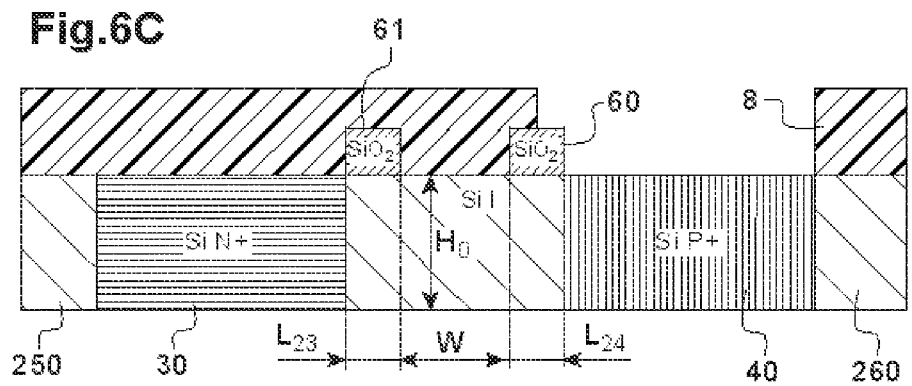
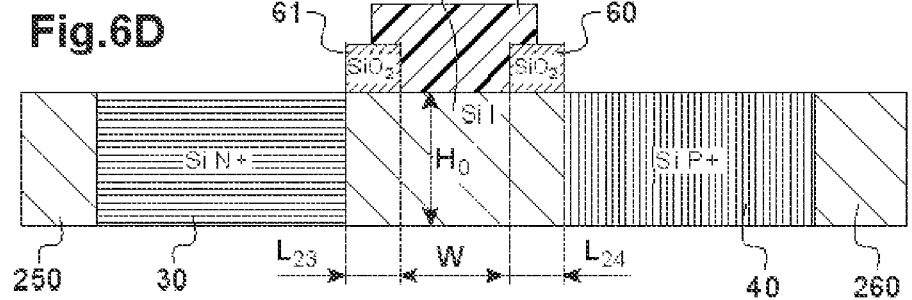

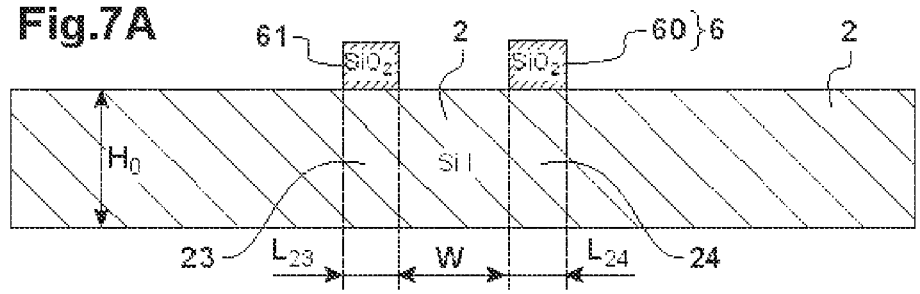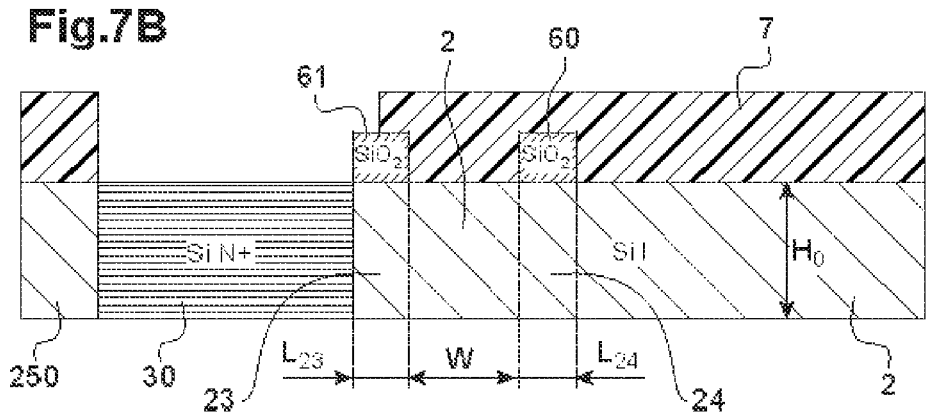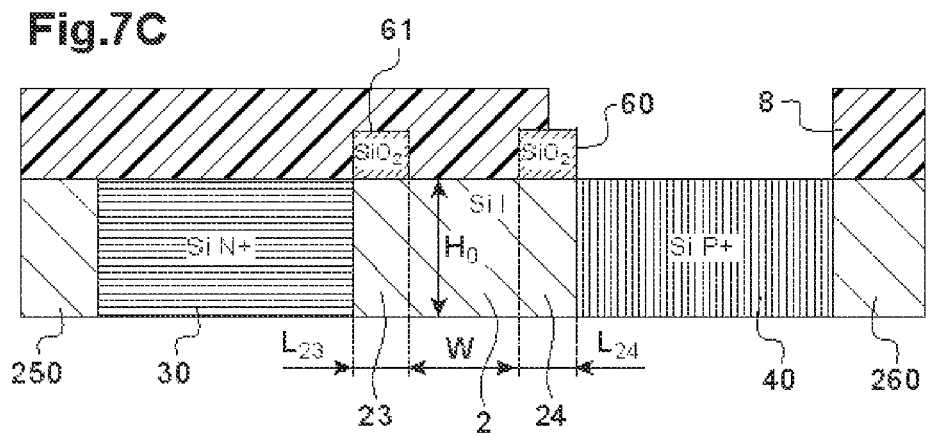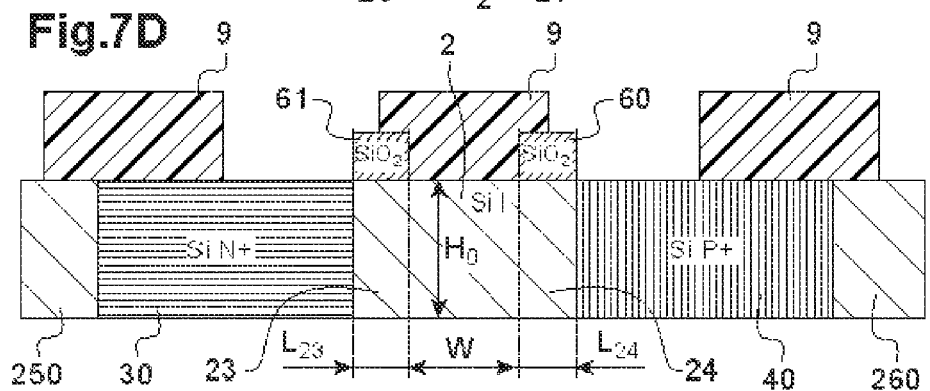

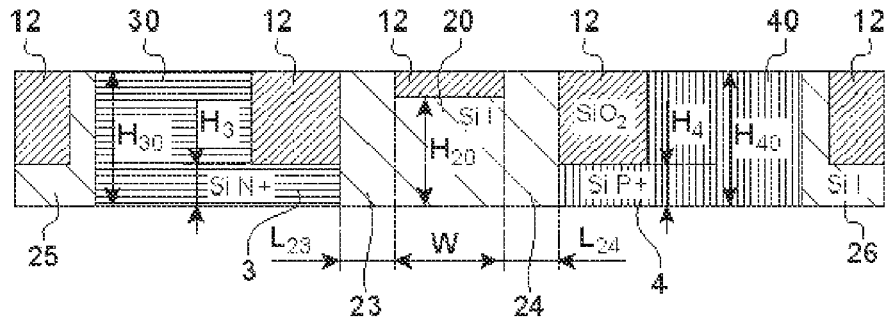
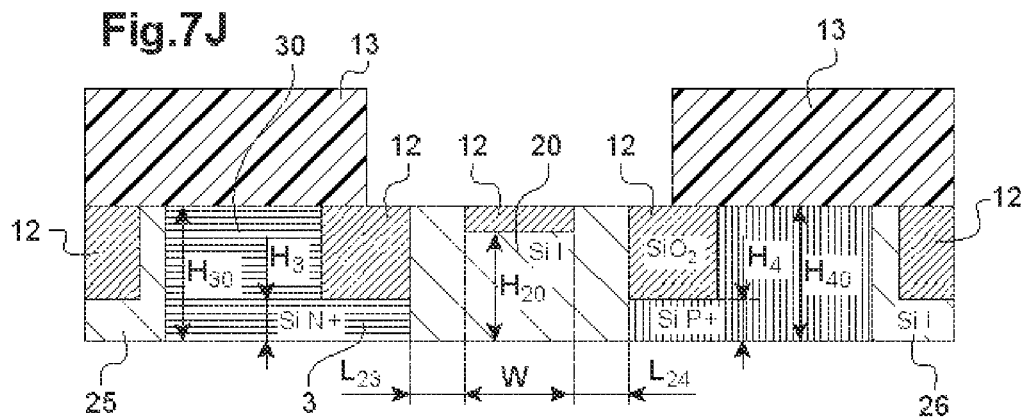
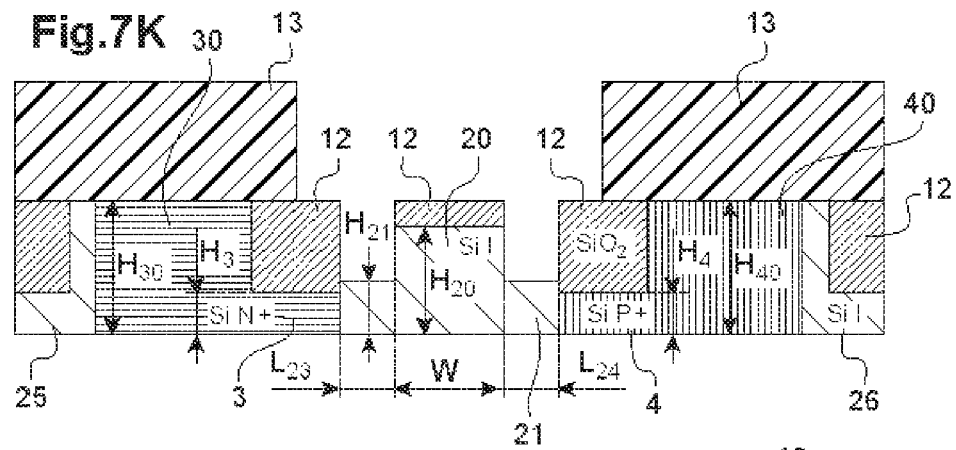
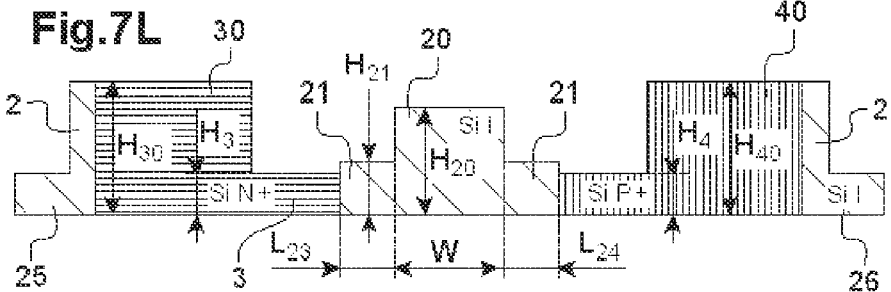

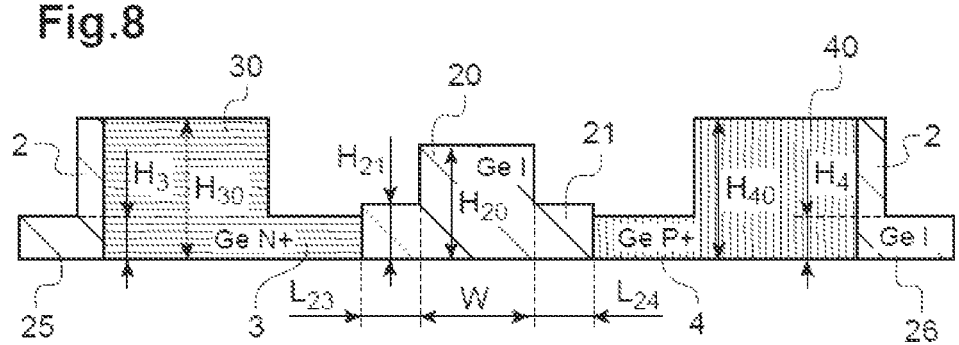
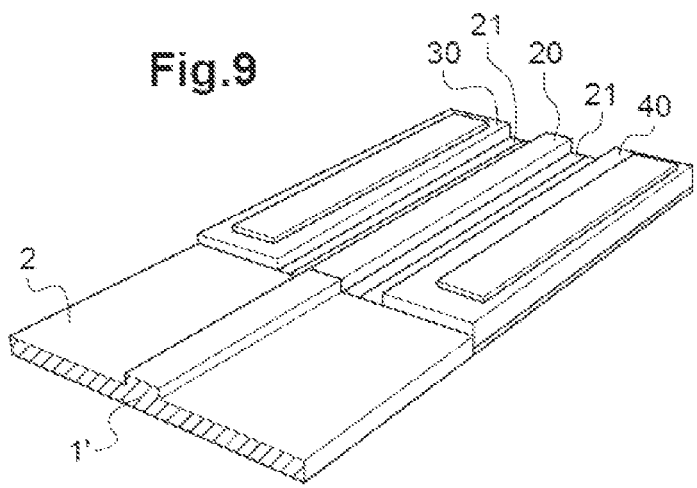

PROCESS FOR FABRICATING A RIDGE PIN JUNCTION COMPRISING SPACED APART DOPED REGIONS, APPLICATION TO THE FABRICATION OF ELECTRO-OPTICAL MODULATORS AND PHOTODETECTORS

FIELD OF THE INVENTION

The present invention relates to the field of integrated photonics on silicon. The technology employed is that of the on-silicon microphotonics, which is compatible with microelectronics technology.

It more particularly relates to production of a ridge pin junction, optionally formed in a waveguide, and to p-doped and n-doped regions spaced apart from the edges of the ridge.

The present invention more particularly relates to an electro-optical modulator employing such a pin junction in a ridge waveguide made entirely of silicon. The guide is suitable for guiding light at optical telecommunications wavelengths, typically longer than 1.1 μm. The electro-optical modulator especially allows light passing through it to be modulated by an electrical control signal. The modulator may operate with electrical control signals having high frequencies, typically of about several tens of GHz.

The modulator according to the present invention employs a ridge optical waveguide the cross section of which may be submicron sized. A pin junction is formed in this ridge guide. Under the effect of an electrical control signal, carriers (electrons/holes) are injected into the pin junction, and therefore into the waveguide. This carrier injection modifies the effective index of the optical field propagating in the waveguide and therefore causes the intensity of the optical field to vary.

It will be noted here that an electro-optical modulator with the pin junction according to the invention operates by carrier injection, contrary to other modulators the pn or pipin junction of which is intended to operate by carrier depletion.

Although described with reference preferentially to the electro-optical modulator application, the present invention also relates to the fabrication of an photodetector made entirely of germanium. A photodetector allows an optical signal that it receives, in particular an optical signal modulated by an electro-optical modulator, to be converted into an electrical signal.

Moreover, the process according to the invention may be used to produce any ridge pin junction comprising doped regions spaced apart from the ridge, which is employed in any other electronic component.

DESCRIPTION OF RELATED ART

An electro-optical modulator is formed using one or more waveguides each allowing an optical wave that passes through it to be modulated by varying the effective index of optical field.

Thus, modulators employing one (or more) ridge waveguide(s) in which a pin junction is formed are known, the p- and n-doped regions being spaced apart from the edges of the ridge and allowing free carriers to be injected into the ridge waveguide.

Reference may for example be made to publication [1], which describes an electro-optical micromodulator having a ring interferometer structure comprising a ridge waveguide in which a pin junction is formed. Such an electro-optical micromodulator has been reproduced in FIG. 1.

It is made up of a straight optical guide 1' and a ring optical guide 1. The pin junction, here an $n^+ip^+$ junction, is formed in the ridge-structured ring waveguide 1: the cross section shows the $n^+$-doped, the unintentionally doped and the $p^+$-doped silicon regions, referenced 3, 2 and 4, respectively. The guides 1, 1' are spaced apart by a distance e allowing the ring guide 1 to be coupled to the straight guide 1' and vice versa. As better shown in the detail view, the optical ring waveguide 1 has what is called a ridge guide structure, is made of silicon and is formed from a region 2 made of intrinsic silicon, i.e. of unintentionally doped silicon, located between a region 3 made of $n^+$-doped silicon and a region 4 made of $p^+$-doped silicon. Thus, this guide forms a pin diode or junction. The doped regions 3 and 4 are formed in a layer and the intrinsic region 2 has a ridge-shaped cross section.

By biasing the pin diode with a voltage VF, the concentration of carriers in the guide 1 is modified by injection. This modification induces a change in the effective index of the waveguide seen by the optical field propagating therein. By way of the ring interferometer, this variation in effective index is translated into a variation in the intensity of the optical field. The authors of publication [1] demonstrated that such a structure may operate up to modulation speeds higher than 30 GHz, provided the modulating voltage VF has a suitable waveform.

Publication [2] describes a process for producing such a pin junction in a ridge waveguide, this pin junction, which comprises spaced apart doped regions, is shown in greater detail in FIG. 3. Using the references indicated in FIG. 3, the ridge 20 of the pin junction that defines the optical waveguide must have a nominal width W of 450 nm and a nominal height H20 of 250 nm. The nominal unitary widths $L_{23}$ and $L_{24}$ of the silicon slab 21 on either side of the ridge must be equal to 200 nm. The diameter of the ring is 12 μm. The spacing e between the straight optical guide 1' and the ring optical guide 1 is 200 nm. Moreover, due to the fabrication process described in publication [2], the heights H21, H3, H4 of the slab 21 and the doped regions 3, 4, respectively, and of the silicon outside of these regions, are equal to one another and to 50 nm.

To obtain smaller access resistances to the pin junction, it is known to produce projections in portions of the doped regions, as illustrated in FIG. 4: the projections 30, 40 in the doped regions 3, 4 are then the same height as the ridge 20, i.e. $H_{30}=H_{40}=H_{20}$.

Now, with reference to FIGS. 5A to 5E, the various production steps of the process described in publication [2] will be described.

First, an etching mask 6 made up of a single strip of unitary width W that defines the width of the ridge 20 of the waveguide to be produced (FIG. 5A) is formed on the silicon layer of initial height H0=H20. This step of forming the hard mask 6 is carried out by e-beam lithography, a time-consuming and expensive step.

Next, the silicon layer is dry etched to a given depth in order to obtain the thin silicon slab of height H2 (FIG. 5B). This height H2 is the final height of the doped regions 3, 4 and of the slab 21 on either side of the ridge 20. For its part, the ridge 20 has a height H20 equal to the initial height H0 of the layer 2.

The hard mask 6 is then removed and a first resist mask 7 is then formed by photolithography on the layer 2, a first region 3 of the layer 2 however being left free, said first region 3 defining a first implantation region 3 that is spaced apart by a distance $L_{23}$ from one edge of the ridge 20 (FIG. 5C).

Next, an $n^+$-type dopant is implanted into the first implantation region 3 (FIG. 5C). The implantation of the $n^+$-type dopant may be achieved by implanting phosphorus with a concentration of $10^{19}$ atoms per cm$^3$.

Next, once the first region 3 has been doped, the first resist mask 7 is removed.

Next, a second resist mask 8 is formed by photolithography on the layer 2 and the n⁺-doped region, a second region 4 of the layer 2 however being left free, said region defining a second implantation region 4 that is spaced apart by a distance $L_{24}$ from the other edge of the ridge 20 (FIG. 5D).

A p-type dopant is then implanted into the second implantation region (FIG. 5D). The p⁺-type dopant may be boron with a concentration of $10^{19}$ atoms per cm³.

Next, once the second region 4 has been doped, the second resist mask 8 is removed (FIG. 5E).

A major drawback of the process known from publication [2] and described with reference to FIGS. 5A to 5E is related to the intrinsic alignment precision of a resist mask in a conventional photolithography process, relative to an underlying element: this alignment precision is roughly equal to ±100 nm.

Thus, if the steps of this known process are applied, the unitary widths $L_{23}$ and $L_{24}$ of the slab 21 in FIGS. 3 and 4, which define the spacing of each doped region 3, 4 relative to the ridge 20, are equal to 200 nm±100 nm.

However, there may be adverse effects if the spacings L23 and L24 are defined with a relatively low precision i.e. with a precision of about ±100 nm, as, in particular:
- the performance of the electronic component employing the pin junction will be affected;
- performance will not be reproducible from one component to another on a given SOI silicon substrate; and
- performance will not be reproducible from one SOI silicon substrate to another SOI substrate.

For example, such relatively low spacing precision (±100 nm) may also affect the performance of a germanium-on-silicon guided photodetector consisting of a germanium pin junction, such as that described in publication [3].

Such a germanium photodetector 5 has been reproduced in FIG. 2. It consists of an intrinsic region 50 flanked on either side by a region 51 made of germanium doped with an n-type dopant and a region 52 made of germanium doped with a p-type dopant. Each of these doped regions 51, 52 is covered with an electrode 53, 54, respectively. The germanium photodetector 5 is arranged at the end of a straight optical waveguide 1' made of silicon, in order to convert the guided optical signal into an electrical signal.

Thus, whatever the electronic component (electro-optical modulator made of silicon, photodetector made of germanium or otherwise) employing a pin junction formed in a ridge guide, it is therefore essential to provide a process allowing imprecision in the spacing between the p- and n-doped regions and the intrinsic region to be decreased in order to improve performance and guarantee component reproducibility.

To obtain this goal, it could be envisaged for each step of the process to use techniques that are more time-consuming and/or more expensive than the conventional photolithography technique, such as the e-beam lithography technique.

There is therefore a need to decrease the imprecision in the positioning of the p- and n-doped regions relative to the intrinsic region of a pin junction formed in a ridge guide, without recourse to techniques that are more time-consuming and/or more expensive than the conventional photolithography technique.

The aim of the invention is to meet at least some of these needs.

SUMMARY OF THE INVENTION

To do this, the invention firstly relates, according to a first alternative, to a process for fabricating a semiconductor ridge pin junction, comprising the following steps in succession:

a) forming a first hard mask, consisting of a first strip and a second strip that are separated from each other, on a semiconductor layer, the distance separating the two strips defining the width of the ridge whereas the unitary width of the first strip defines the spacing between the ridge and a p-doped region and the unitary width of the second strip defines the spacing between the ridge and an n-doped region;

b) implanting a p-type and an n-type dopant, respectively, into a region and into a region, respectively, outside the first strip and the second strip, respectively;

c) partially etching the semiconductor in the doped regions and regions of the semiconductor layer outside the space separating the two strips of hard mask;

d) partially etching the semiconductor layer inside the space separating the two strips to define the height of the ridge of the pin junction;

e) full-wafer deposition of a layer of hard material;

f) carrying out full-wafer chemical-mechanical polishing (CMP) until the first strip and second strip of semiconductor layer protruding on either side of the ridge are reached in order to remove the first hard mask and to form a second hard mask covering the ridge, the doped regions etched in step c) and the regions of the semiconductor layer outside of the space and etched in step c);

g) partially etching the first and second strips of the semiconductor layer left free by the second hard mask so as to define a slab on either side of the ridge and joined with the etched p-doped and n-doped regions thus forming the ridge pin junction; and h) removing the second hard mask, process in which the hard masks and resist masks formed in steps a) to d) are produced by photolithography.

The expression "hard mask" is here, and in the context of the invention, understood to mean a mask made of a mineral material that is not removed during removal of the masking resists used in the conventional photolithography technique.

The expression "full-wafer deposition" is here, and in the context of the invention, understood to have the conventional technological meaning i.e. deposition of a layer on top of and covering the entire surface of a substrate.

The term "projections" is here, and in the context of the invention, understood to mean protuberances jutting out relative to the semiconductor regions that are smaller in height because they result from etching.

The invention therefore allows the p- and n-doped regions to be positioned, relative to the edges of the ridge, with a precision better than 20 nm using the conventional photolithography technique.

In other words, the invention consists in making judicious choices when defining hard masks and the sequence in which resist masks are formed for implantation (doping) and etching, which choices enable the conventional photolithography technique to be used despite the low precision of mask alignment (±100 nm) relative to underlying regions.

In yet other words, this level of positioning precision, i.e. ±20 nm or advantageously ±5 nm, is obtained without recourse to other techniques that are more time-consuming and/or more expensive to carry out, such as an e-beam lithography technique.

By virtue of the process according to the invention, a ridge pin junction is formed, at lower cost and with shorter production times than in the prior art, with doped regions precisely spaced apart from the edge of the ridge.

Thus, the pin junction obtained with the process of the invention makes it possible:
- to obtain a good performance from the component, such as a modulator, that employs the in-guide junction;
- to reproduce reliably the performance of a component on a given substrate; and
- to reproduce reliably the performance of this component from one substrate to another.

According to one advantageous embodiment, steps b) to d) consist in succession in:
forming a first resist mask on the first hard mask and on the semiconductor layer, such that the first resist mask covers the space bounded between the two strips of hard mask and is superposed on one of the strips while leaving free a first layer region defining the first implantation region;
implanting an n-type dopant into the first implantation region;
removing the first resist mask;
forming a second resist mask on the first hard mask and on the semiconductor layer, such that the second resist mask covers the space bounded between the two strips and is superposed on the other strip while leaving free a thin second layer region defining a second implantation region;
implanting a p-type dopant into the second implantation region;
removing the second resist mask;
forming a third resist mask on top of the first hard mask and on the semiconductor layer, such that the third resist mask covers the space bounded between the two strips while being set back relative to the external edges of the two strips, and while leaving free at least one portion of the two p- and n-doped regions and the regions of the semiconductor layer outside the doped regions;
etching the layer through the third resist mask and the first hard mask;
removing the third resist mask;
forming a fourth resist mask on the first hard mask and on the semiconductor layer, such that the fourth resist mask is superposed on the strips of the first hard mask, on the outside regions and on the etched doped regions, while leaving the space bounded between them free;
etching the thin layer through the fourth resist mask and the first hard mask until the ridge height is obtained between the two strips of the first hard mask; and
removing the fourth resist mask.

According to a first advantageous variant of the step of forming the third resist mask, the latter only covers the space bounded between the two strips, thus leaving the two p- and n-doped regions completely free.

According to a second advantageous variant of the step of forming the third resist mask, the latter simultaneously covers the space bounded between the two strips, at least one external portion of the two p- and n-doped regions and one portion of the external regions of the semiconductor layer adjacent each external portion, so that once produced in the successive etching step, the external portions define projections in the p- and n-doped regions of height equal to that of the ridge, the process comprising, after the step f) of CMP polishing:
a step of forming a fifth resist mask covering the projections in the p- and n-doped regions and the projections and the layer which are adjacent the projections in the doped regions which are not covered by the second hard mask, and superposed on the etched doped regions and on the etched outside regions of the layer; and
a step of removing the fifth resist mask before step h) of removing the second hard mask.

This second variant is advantageous because it also allows projections to be formed in the p- and n-doped regions with a very high alignment precision relative to the edges of the ridge, thereby greatly and precisely decreasing the access resistances to the pin junction. Thus, electronic components employing such a projection-comprising pin junction see their performance further improved. In particular, an electro-optical modulator employing such a projection-comprising pin junction has a lower access resistance. A photodetector employing such a projection-comprising pin junction also has a lower access resistance.

Preferably, the hard material deposited in step e) is the same as that forming the first hard mask. Thus, the same material, advantageously silica, is used for the full-wafer deposition and to produce the hard masks.

Also preferably, the first and/or second hard mask(s) is (are) made of a hard material chosen from silica and silicon nitride.

According to a first embodiment of the semiconductor layer, the latter is a thin silicon layer.

According to a second embodiment of the semiconductor layer, the latter is made from a semiconductor other than silicon and is formed on a thin silicon layer. According to this second embodiment, the semiconductor layer is advantageously a thin germanium layer.

Preferably, the ridge junction obtained by the process according to the invention is formed in a waveguide.

The invention in another of its aspects also relates to a side-entry electro-optical modulator formed in the silicon layer preferably of an SOI substrate, or to a photodetector formed in a thin germanium layer formed on the thin silicon layer preferably of an SOI substrate, obtained according to the process described above. An electro-optical modulator employing the pin junction in a ridge guide according to the invention operates by carrier injection.

Lastly, the invention relates to an electro-optical modulator made of silicon or to a photodetector made of germanium, obtained according to the process of the invention, characterized in that the height of the slab, measured in cross section, is different from the height of adjacent portions of the doped regions. This height difference may be measured, typically to ±5 nm, even to ±10 nm, by means of a FIB (focused ion beam).

BRIEF DESCRIPTION OF THE DRAWINGS

Other advantages and features of the invention will become more apparent on reading the detailed description of the invention given by way of nonlimiting illustration with reference to the following figures, in which:

FIGS. 5A to 5E are cross-sectional views illustrating the various production steps of a process for fabricating a ridge pin junction according to FIG. 3;

FIGS. 6A to 6K are cross-sectional views illustrating the various steps of a first embodiment of the process for fabricating a pin-junction-containing ridge waveguide according to the invention for an electro-optical modulator;

FIGS. 7A to 7L are cross-sectional views illustrating the various steps of a second embodiment of the process for fabricating a pin-junction-containing ridge waveguide according to the invention for an electro-optical modulator;

FIG. 8 is a cross-sectional view of a germanium photodetector obtained according to the process of the invention, formed in a germanium layer on top of a silicon layer; and FIG. 9 is a perspective view of the germanium photodetector in FIG. 8.

DETAILED DESCRIPTION

Figure 1:
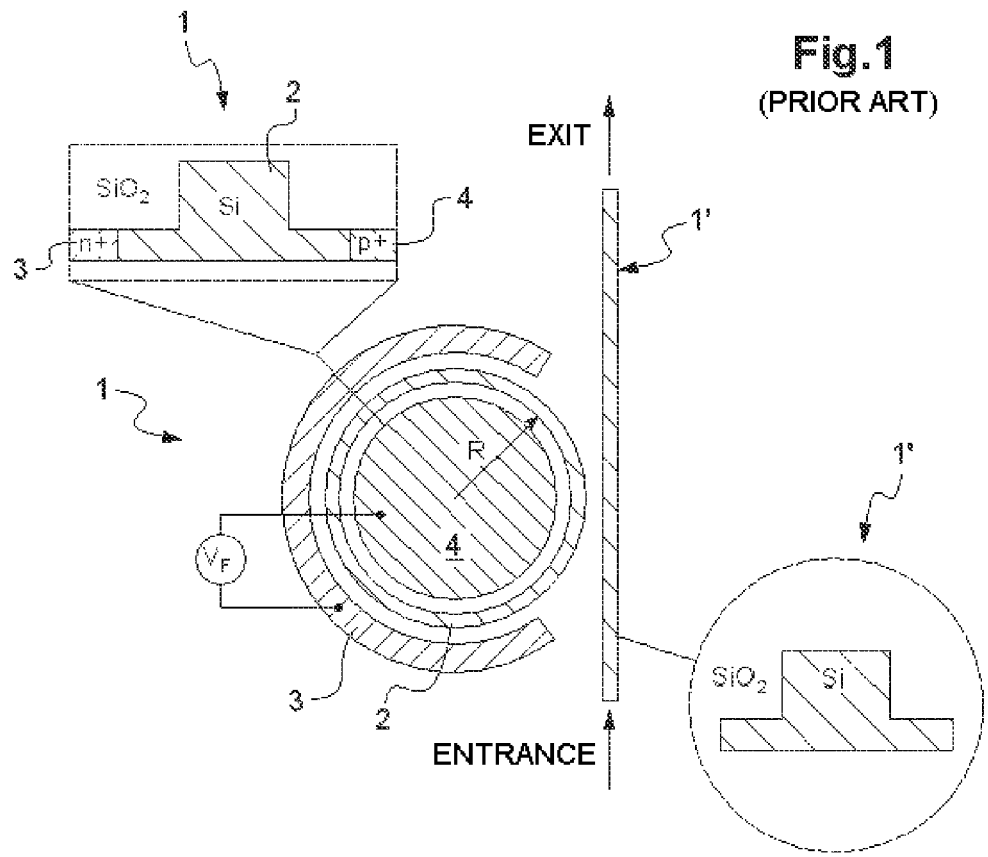
FIG. 1 contains a top view of an integrated silicon electro-optical modulator on an SOI substrate according to the prior art and a cross-sectional view of the pin-junction-containing ridge optical waveguide of the modulator.
Figure 2:
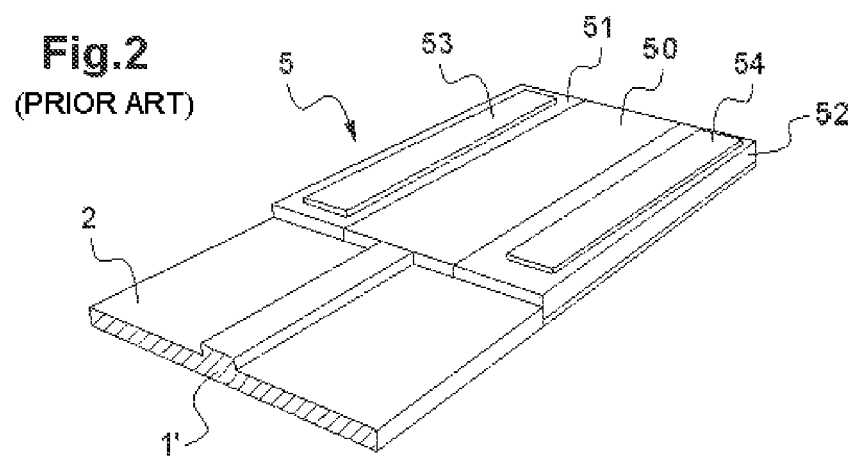
FIG. 2 is a perspective view of an integrated germanium photodetector on an SOI substrate according to the prior art.
Figure 3:
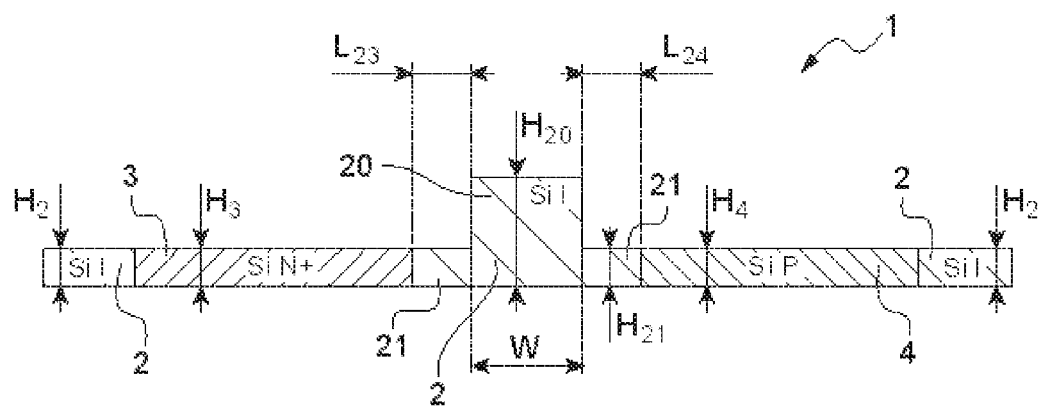
FIG. 3 is a cross-sectional view of the pin-junction-containing ridge optical waveguide in FIG. 1 indicating the relative dimensions obtained with a fabrication process according to the prior art.
Figure 4:
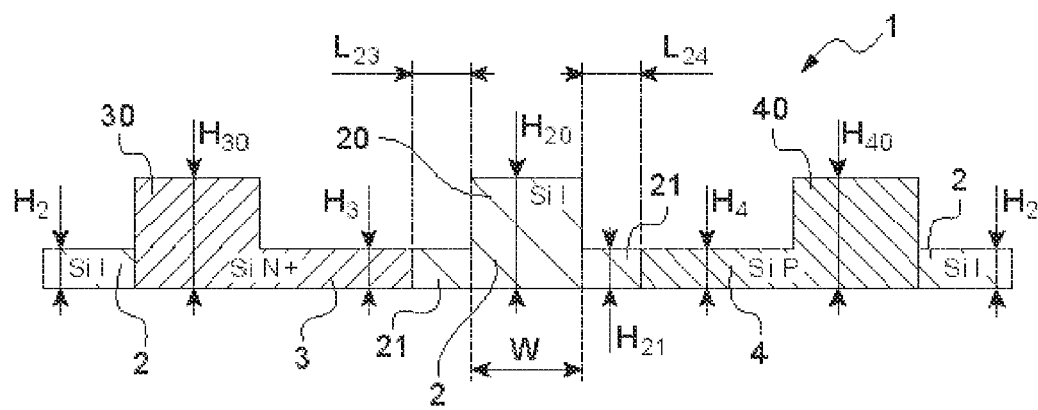
FIG. 4 illustrates an advantageous variant of FIG. 3, according to the prior art, showing a projection in a portion of the p-type and n-type doped regions.

FIGS. 1 to 5E, relating to the prior art, have already been commented on in the preamble. They are therefore not described in further detail below.

For the sake of clarity, corresponding elements of a ridge pin junction according to the prior art and of a ridge pin junction according to the invention have been referenced with the same reference numbers.

It will also be noted that here and throughout the present application, the terms "lower", "upper", "inside", "outside", "internal" and "external" are meant to be understood relative to a cross-sectional view of a ridge pin junction according to the invention, i.e. a view orthogonal to the plane of the substrate on which the junction is produced, with the ridge vertical and above the thin semiconductor layer.

The terms "outside" and "inside" are also meant to be understood relative to a cross-sectional view of a ridge pin junction according to the invention.

The terms "height" and "thickness" are meant to be understood as being synonymous.

It will also be noted that in all of FIGS. 6A to 12, the symbol of the material forming a given region has been indicated.

Thus, with a silicon layer:
Si I designates intrinsic silicon, i.e. unintentionally doped silicon; and
Si $P^+$ and Si $N^+$ designate $p^+$-doped silicon and $n^+$-doped silicon, respectively.

With a germanium layer:
Ge I designates intrinsic germanium, i.e. unintentionally doped germanium; and
Ge $P^+$ and Ge $N^+$ designate $p^+$-doped germanium and $n^+$-doped germanium, respectively.

It will also be noted that the dielectric layer deposited last on the ridge 20 and on the doped regions 3, 4 of the pin junction obtained according to the process of the invention has not been shown.

Lastly, it will be noted that neither production of the silica ($SiO_2$) layer in which the ridge pin junction according to the invention is buried, nor production of the metal contacts that form the electrodes making electrical contact with the doped regions has been described in detail. In the context of the invention, finishing steps such as described in publication [2] may be carried out, namely a step of depositing a silica layer having a thickness of about 1 μm, followed by a dopant-activating annealing step, for example 15 seconds at 1050° C. for the $p^+$ dopant and 13 minutes at 900° C. for the $n^+$ dopant, then a step of opening holes (vias) in the silica and filling them with metal in order to form the electrical contacts of the electrodes.

According to the invention, a ridge pin junction forming a waveguide of an electro-optical modulator is obtained with a fabrication process the steps of which only use conventional photolithography.

The successive steps of the fabrication process according to a first embodiment of the invention are described with reference to FIGS. 6A to 6K.

The pin junction 1 is produced from a semiconductor layer 2 that is initially unintentionally doped. This layer may be a silicon layer of an SOI substrate covering a buried oxide layer.

A first hard mask 6 consisting of two strips 60, 61 of a unitary width L23, L24 and spaced apart from each other by a distance W is formed in the layer 2 of initial thickness $H_0$ by photolithography (FIG. 6A).

At the end of the fabrication process, W defines the width of the ridge 20, and the unitary widths $L_{23}$, $L_{24}$ define the spacings between the edges of the ridge 20 and the $n^+$-doped region 3 and the $p^+$-doped region 4, respectively. These unitary widths $L_{23}$, $L_{24}$ thus define the widths of the slab 21 of the unintentionally doped semiconductor of the layer 2 that will be obtained on either side of the ridge 20 at the end of the process. In other words, the strips 60, 61 of hard mask are each superposed on strips 24, 23 of the unintentionally doped semiconductor layer 2 of unitary width L24, L23, respectively. These unitary widths $L_{23}$, $L_{24}$ may be equal to each other. As will become clear from the following, these unitary widths $L_{23}$, $L_{24}$ of the strips 60, 61 of hard mask are judiciously selected to obtain, on the one hand, a given spacing between the edges of the ridge 20 and each of the doped regions 3, 4, and on the other hand, to take into account the alignment imprecision of the conventional photolithography technique, equal to ±100 nm. Choosing the widths L23 and L24 of the strips 60, 61 of hard mask so that they are larger than the alignment imprecision makes it possible, with certainty, to ensure the resist masks are superposed on portions of the hard masks employed in the process. Typically, if the dimensions of the mask 6 are subject to conventional photolithography tolerances, i.e. equal to ±5 nm, a distance W between the two strips 60, 61 equal to 450±5 nm is obtained and a unitary width $L_{23}$, $L_{24}$ for each strip 60, 61 equal to 200±5 nm.

The first hard mask is formed by etching a layer of hard material. Such as illustrated, the first hard mask 6, formed by the strips 60, 61, is made of silica. It may also be made of silicon nitride or of any other mineral material that is not removed during removal of the resists used in conventional photolithography techniques.

Next, a first resist mask 7 is formed on the strips 60, 61 of the first hard mask 6 and on the layer 2 by photolithography. This first resist mask 7 thus covers the space 20 bounded between the two strips 60, 61 and is superposed on the strip 61, i.e. it covers at least some of the strip 61, while leaving free a first layer region 30 defining a first implantation region (FIG. 6B). As specified above, the unitary width $L_{23}$ of the strip 61 of the hard mask 6 is chosen to be larger in size than the alignment imprecision of the resist mask 7 produced by photolithography, which imprecision is equal to ±100 nm. Thus, the resist mask 7 is systematically superposed on the strip 61 of hard mask 6 despite the typical alignment imprecision of the photolithography technique.

In other words, the first implantation region 30 is defined between the strip 61 of hard mask and a region 250 of layer 2 located outside, i.e. laterally opposite, the strip of hard mask, this region 250 being covered by the first resist mask 7 (FIG. 6B).

Next, an $n^+$-type dopant is implanted into the first implantation region 30 (FIG. 6B). It will be noted here that the implantation, whether it is a question of an n-type or p-type dopant, may be achieved by ion implantation or by plasma implantation. When it is desired to produce a pin junction according to the invention for a photodetector, ion implantation will preferably be used. The $n^+$-type dopant may be phosphorous with a concentration of $10^{19}$ atoms per $cm^3$.

Next, once the first region 30 has been doped, the first resist mask 7 is removed.

Next, a second resist mask 8 is formed on the strips 60, 61 of the first hard mask 6 and on the thin layer 2. Thus, this second resist mask 8 covers the space 20 bounded between the two strips 60, 61 and is superposed on the strip 60, i.e. it at least partially covers the strip 60, while leaving free a second layer region 40 defining a second implantation region (FIG. 6C). As above, the unitary width L24 of the strip 60 of hard mask 6 is chosen to be larger than the alignment imprecision of the resist mask 8 produced by photolithography, which imprecision is equal to ±100 nm. Therefore, here again the resist mask 8 is systematically superposed on the strip 60 of hard mask 6 despite the typical alignment imprecision of the photolithography technique.

In other words, the second implantation region 40 is defined between the hard mask strip 60 and a region 260 of layer 2 located outside, i.e. laterally opposite, the strip of hard mask, this region 260 being covered by the second resist mask 8 (FIG. 6C).

A p-type dopant is then implanted into the second implantation region 40 (FIG. 6C). The p$^+$-type dopant may be boron with a concentration of $10^{19}$ atoms per cm$^3$.

Next, once the second region 40 has been doped, the second resist mask 8 is removed.

Next, a third resist mask 9 is formed on top of the strips 60, 61 of the first hard mask 6 and on the space 20 on the layer 2 bounded between the two strips 60 and 61. This third resist mask 9 therefore covers the space 20 bounded between the two strips and thus leaves the two p- and n-doped regions 30, 40 and the outside regions 250, 260 of the layer 2 completely free (FIG. 6D).

Figure 6E:
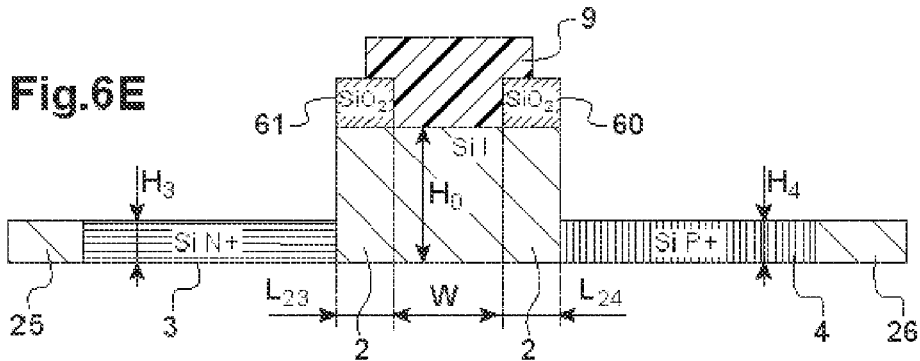

Next, the material of the layer 2 not covered with the resist mask 9 and the strips 60, 61 of hard mask are partially etched to leave a thickness of material, this thickness preferably being substantially constant for all the exposed regions. Thus, the thicknesses of the etched doped regions 3 and 4 and of the etched outside regions 25, 26 of intrinsic semiconductor are equal (FIG. 6E).

The third resist mask 9 is then removed.

Figure 6F:
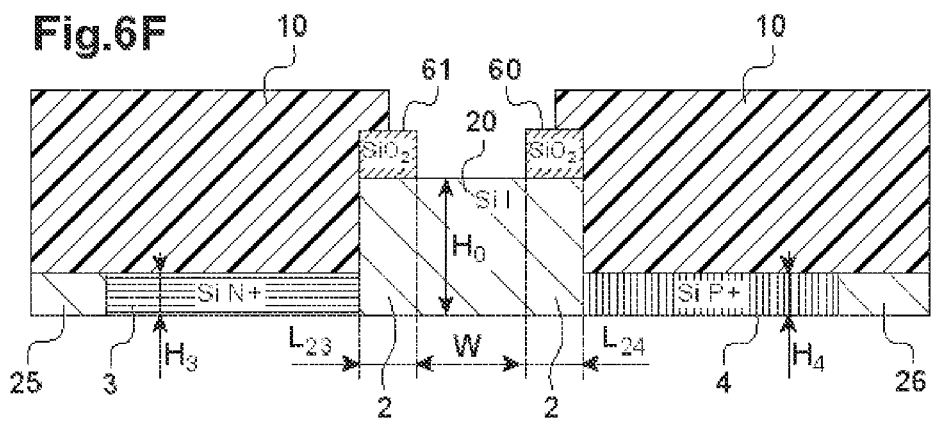

Next, a fourth resist mask 10 is formed that is superposed on each strip 60, 61 of the first hard mask 6, on the etched outside regions 25, 26 and on the etched doped regions 3, 4, while leaving free the space 20 bounded between the strips 60, 61 of the hard mask 6 (FIG. 6F). As explained above, the unitary widths $L_{23}$, $L_{24}$ of the strips 60 and 61 of the hard mask 6 are chosen to be larger than the alignment imprecision of the resist mask 10 produced by photolithography, which imprecision is equal to ±100 nm. Therefore, here again the resist mask 10 is systematically superposed on, i.e. systematically at least partially covers, each of the strips 60, 61 of hard mask 6 despite the typical alignment imprecision of the photolithography technique.

Figure 6G:
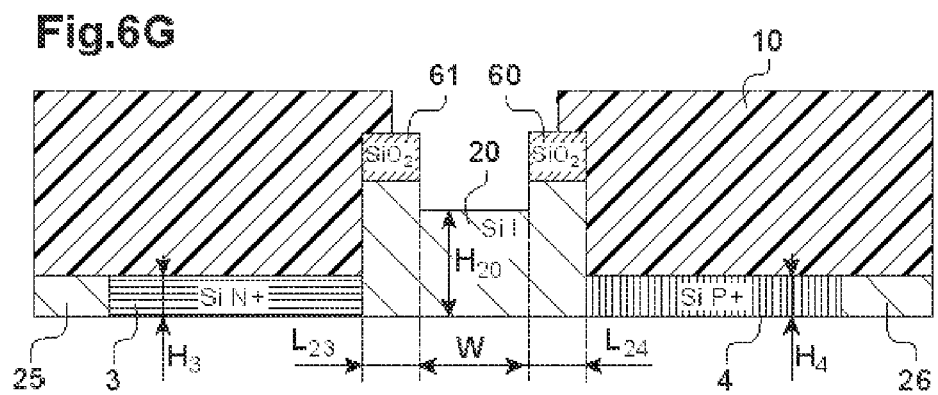

The semiconductor is then etched through the fourth resist mask 10 and the first hard mask 6, i.e. in the space 20 bounded by the strips 60, 61 of the latter, until the ridge 20 height $H_{20}$ is obtained between the two strips 60, 61 (FIG. 6G). The fourth resist mask 10 is then removed.

Figure 6H:
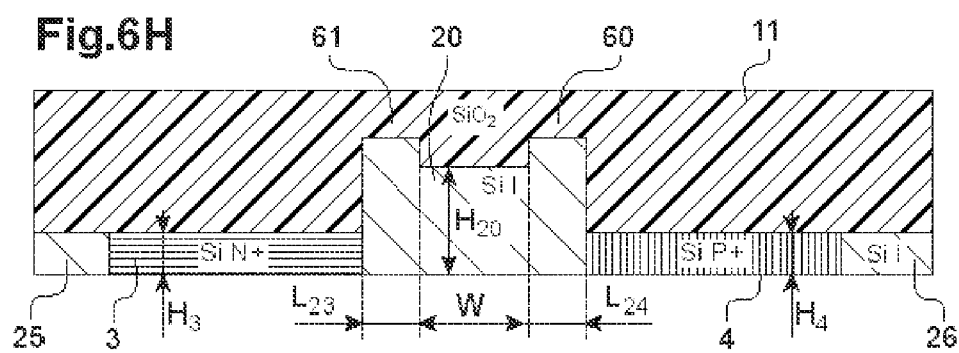

Next, a full-wafer deposition of a layer 11 of material of the same nature as the hard mask 6 is carried out: thus the first hard mask 6 is buried by the full-wafer layer 11 (FIG. 6H).

Figure 6I:
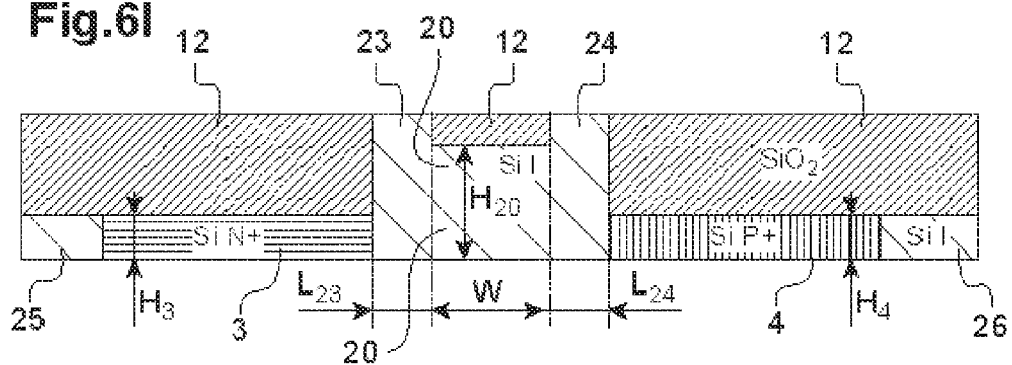

Next, full-wafer chemical-mechanical polishing (CMP) is carried out until the first and second strips 23, 24 of the yet unetched semiconductor layer 2, protruding on either side of the ridge 20, are reached (FIG. 6I). It will be noted that these first and second strips 23, 24 are those under the strips 61, 60 of the first hard mask 6, respectively. The first hard mask 6 has thus disappeared, and a second hard mask 12 has been formed covering the ridge 20, the doped regions 3, 4 and the outside regions 25 and 26 of the layer 2 on either side of the doped regions 3 and 4.

Figure 6J:
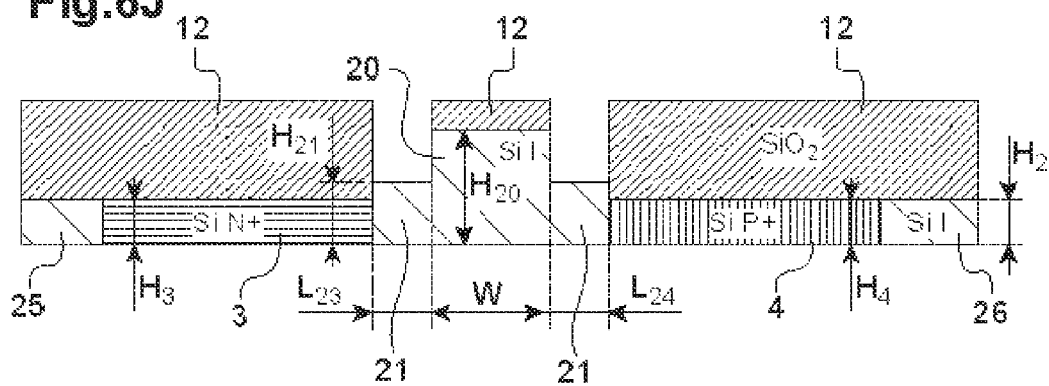

The semiconductor 2 is then partially etched through the second hard mask 12 so as to define a slab 21 on either side of the ridge 20, said slab 21 being joined with the p- and n-doped regions 3, 4, thus forming the ridge pin junction 20, 21 (FIG. 6J).

Figure 6K:
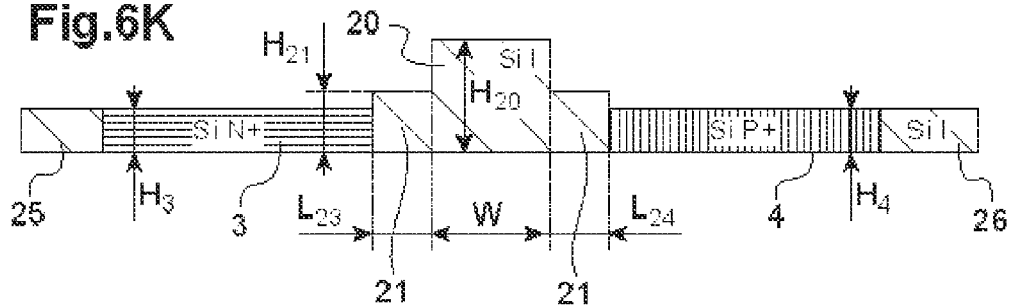

Lastly, the second hard mask 12 is removed (FIG. 6K). As will be clear from FIG. 6K, this process for producing the ridge pin junction is also characterized by the fact that the height $H_{21}$ obtained for the slab 21 is different from the height H3=H4 of the adjacent portions of the doped regions 3, 4 and of the external regions 25, 26 of the intrinsic semiconductor layer 2 on either side of these regions 3, 4. In the example illustrated in FIG. 6K, the height $H_{21}$ of the slab 21 is larger than the height H3=H4 of the adjacent portions of the doped regions 3, 4. This height difference $H_{21}-H_3$ may be measured, typically to ±5 nm, even to ±10 nm, by means of a FIB (focused ion beam).

By virtue of the process according to the first embodiment of the invention, a ridge pin junction is obtained the doped regions 3, 4 of which are separated from the ridge by the slab 21 of intrinsic semiconductor and thus positioned relative to the edges of the ridge 20 with a tolerance better than 5 nm. This precision of 5 nm corresponds exactly to the precision of production of the strip 60 or the strip 61 of the hard mask 6. This precise positioning is advantageously obtained using only a photolithography technique.

The successive steps of the manufacturing process according to a second embodiment of the invention are now described with reference to FIGS. 7A to 7L.

The steps in FIGS. 7A to 7C are exactly identical to FIGS. 6A to 6C described above. Therefore they are not commented on here.

Once the doped regions 30, 40 have been obtained and the second resist mask 8 removed, a third resist mask 9 is formed. This third resist mask simultaneously covers, according to this second embodiment, the space 20 bounded between the two strips 60, 61, at least one external portion 30, 40 of the two p- and n-doped regions and a portion of the external regions 250, 260 of the intrinsic semiconductor layer 2 adjacent each external portion 30, 40 (FIG. 7D). In this way, once produced in the successive etching step, the external doped portions 30, 40 define projections 30, 40 in the p- and n-doped regions of height $H_{30}$, $H_{40}$ equal to the height $H_{20}$ of the ridge 20.

Figure 7E:
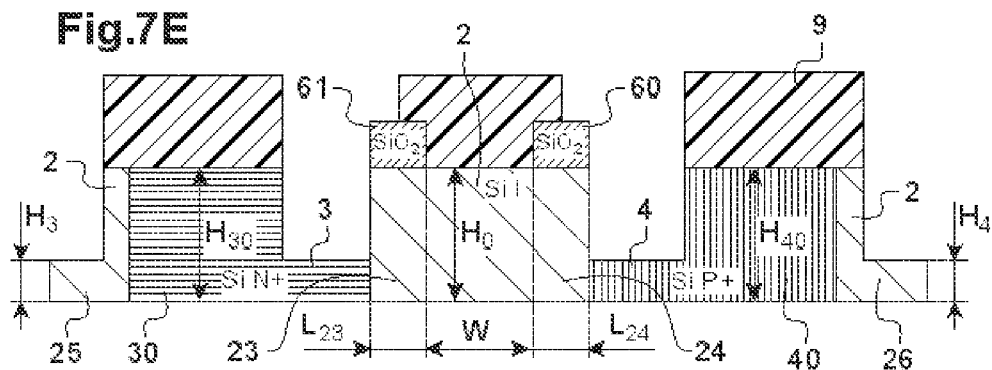

The partially etching step illustrated in FIG. 7E is carried out in an identical way to that illustrated in FIG. 6E. The initial height H0 of the silicon layer 20 then becomes equal for the doped regions 3, 4 on either side of the ridge 20 and for the intrinsic semiconductor 2 outside of these regions 3, 4: $H_3=H_4=H_2$. The third resist mask 9 is then removed. In contrast, the height $H_{30}=H_{40}$ of the external portions 30, 40 masked by the third mask is equal to the height $H_{20}$ of the ridge 20 also masked by the mask 9.

Figure 7F:
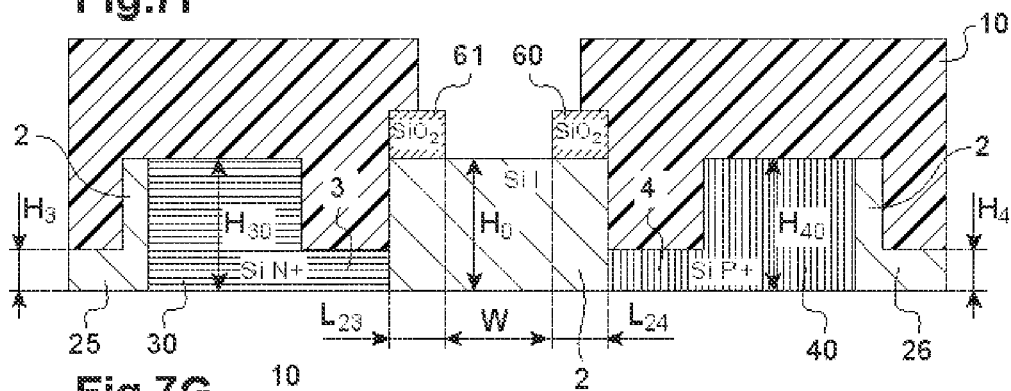

Next, a fourth resist mask 10 is formed, this mask 10 being superposed on each strip 60, 61 of the first hard mask 6, on the etched outside regions 25, 26 and on the etched or unetched doped regions 3, 4 or 30, 40, respectively, while leaving free the space 20 bounded between the strips 60, 61 of the hard mask 6 (FIG. 7F). As explained above for the first embodiment, the unitary widths $L_{23}$, $L_{24}$ of the strips 60, 61 of the hard mask 6 are chosen to be larger than the alignment imprecision of the resist mask 10 produced by photolithography, which imprecision is equal to ±100 nm. Therefore, here again the resist mask 10 is systematically superposed on each of the strips 60, 61 of hard mask 6 despite the typical alignment imprecision of the photolithography technique.

Figure 7G:
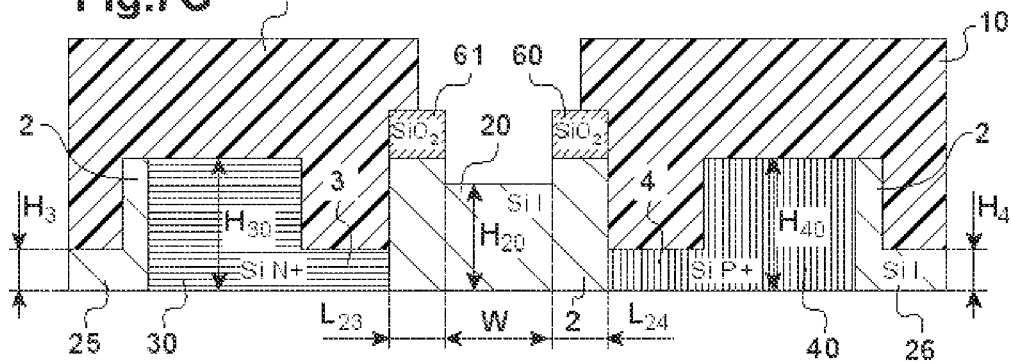

The semiconductor 2 is then partially etched through the fourth resist mask 10 and the first hard mask 6, i.e. in the space 20 bounded by the strips 60, 61 of the latter, until the ridge 20 height $H_{20}$ is obtained between the two strips 60, 61 (FIG. 7G). The fourth resist mask 10 is then removed.

Figure 7H:
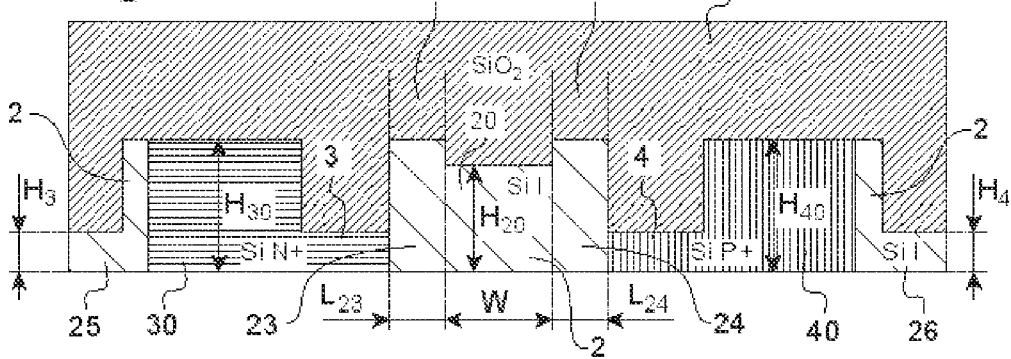

Next, a full-wafer deposition of a layer 11 of material of the same nature as the hard mask 6 is carried out: thus the first hard mask 6 is buried by the full-wafer layer 11 (FIG. 7H).

Next, full-wafer chemical-mechanical polishing (CMP) is carried out until the first and second strips 23, 24 of the intrinsic semiconductor layer 2, protruding on either side of the ridge 20, and the projections 30, 40 in the doped regions 3, 4 are reached (FIG. 7I). These first and second strips 23, 24 are those under the first and second strips 60, 61 of the hard mask, respectively. The first hard mask 6 has thus disappeared, and a second hard mask 12 has been formed covering the ridge 20, the doped regions 3, 4 (except for the protuberances 30, 40 forming the projections) and the outside regions 25 and 26 of the layer 2 on either side of the doped regions 3 and 4.

Next, a fifth resist mask 13 is formed covering the projections 30, 40 in the p- and n-doped regions, the projections in the layer 2 that are adjacent the projections in the doped regions, which projections are not covered by the second hard mask 12, superposed on the etched doped regions 3, 4 and on the etched outside regions 25, 26 of the layer 2 (FIG. 7J). Here again, the resist mask 13 is systematically superposed on the portions of the hard mask 12 despite the typical alignment imprecision of the photolithography technique, which imprecision is equal to ±100 nm.

The semiconductor layer 2 is then partially etched through the second hard mask 12 and the fifth resist mask 13 so as to define a slab 21 on either side of the ridge 20, said slab 21 being joined with the p- and n-doped regions 3, 4, thus forming the ridge pin junction 20, 21 (FIG. 7K).

Lastly, the fifth resist mask 13 is removed then the second hard mask 12 is removed (FIG. 7L).

As will be clear from FIG. 7L, the process for producing the ridge pin junction is also characterized by the fact that the height $H_{21}$ obtained for the slab 21 is different from the height H3, H4 of the adjacent portions of the doped regions 3, 4 and of the external regions 25, 26 of the intrinsic layer 2 on either side of these regions 3, 4. In the example illustrated in FIG. 7L, the height H21 of the slab 21 is larger than the height H3=H4 of the adjacent portions of the doped regions 3, 4. This height difference $H_{21}-H_3$ may be measured, typically to ±5 nm, even to ±10 nm, by means of a FIB (focused ion beam).

By virtue of the process according to the second embodiment of the invention, just like in the first embodiment, a ridge pin junction 20 is obtained the doped regions 3, 4 of which are separated from the ridge by the slab 21 and thus positioned relative to the edges of the ridge 20 with a tolerance better than 5 nm. This precise positioning is advantageously obtained using only a photolithography technique.

Furthermore, a pin junction is obtained with projections 30, 40 also positioned relative to the edges of the ridge 20 with an alignment tolerance better than 5 nm. The pin junction illustrated in FIG. 7L has, over and above that illustrated in FIG. 6K, smaller access resistances when it is implemented in an electro-optical modulator.

A ridge pin junction 20 obtained according to the first or second process described above, when it forms an optical waveguide, shows a good performance due to the aforementioned small alignment uncertainty, and therefore may advantageously be employed in an electro-optical modulator made of silicon.

A photodetector made of germanium may also be obtained using the processes according to the invention described above, the semiconductor layer 2 that is etched then being a germanium layer. This germanium layer is formed, using an epitaxial growth technique, on top of the silicon layer preferably of an SOI substrate in a cavity formed in the silicon layer, as described in publication [3].

FIGS. 8 and 9 illustrate a photodetector according to the invention obtained according to the second process described above, i.e. a photodetector comprising projections 30, 40. As indicated in the preamble with reference to FIG. 2, the ridge 20 and the slab 21 of the pin junction of such a photodetector must be aligned with the straight silicon waveguide 1' produced in the silicon layer 2 of the SOI substrate. The germanium photodetector according to the invention, such as shown in FIGS. 8 and 9, may moreover advantageously be produced at the same time as the ridge of the straight silicon guide 1' because the etch rates of silicon and germanium are identical. In other words, for a photodetector according to the invention, the silicon waveguide may be etched at the same time as the germanium guide because the etch rates are the same.

It will moreover be noted that the height of the slab 21 of the ridge junction 20 of the germanium photodetector is different from that of the slab of the silicon layer of the straight waveguide. Here again, this height difference may be measured, typically to ±5 nm, even to ±10 nm, by means of a FIB (focused ion beam) measurement technique.

The invention is not limited to the examples described above; in particular features of the illustrated examples may be combined together in variants that have not been illustrated.

CITED REFERENCES

[1]: S. Manipatruni, Q. Xu, B. Schmidt, J. Shakya, and M. Lipson, "*High speed carrier injection 18Gb/s silicon micro-ring electro-optic modulator*," in IEEE LEOS Annual Meeting (2007), pp. 537-538;

[2]: Q. Xu, B. Schmidt, S. Pradhan, and M. Lipson, "*Micrometer-scale silicon electro-optic modulator*", Nature, Vol. 435, pp. 325-327, 19 May 2005;

[3]: L. Vivien, "*Zero-bias 40Gbit/s germanium waveguide photodetector on silicon*", OPTICS EXPRESS, January 2012/Vol. 20, No. 2, January 2012.

What is claimed is:

1. A process for fabricating a semiconductor ridge pin junction, comprising the following steps in succession:
   a) forming a first hard mask, consisting of a first strip and a second strip that are separated from each other, on a semiconductor layer, the distance W separating the two strips defining the width of the ridge whereas the unitary width of the first strip defines the spacing between the ridge and a p-doped region and the unitary width of the second strip defines the spacing between the ridge and an n-doped region;
   b) implanting a p-type and an n-type dopant, respectively, into a region and into a region, respectively, outside the first strip and the second strip, respectively;
   c) partially etching the semiconductor in the doped regions and regions of the semiconductor layer outside the space separating the two strips of hard mask;
   d) partially etching the semiconductor layer inside the space separating the two strips to define the height of the ridge of the pin junction;
   e) full-wafer deposition of a layer of hard material;
   f) carrying out full-wafer chemical-mechanical polishing (CMP) until the first strip and second strip of semiconductor layer protruding on either side of the ridge are reached in order to remove the first hard mask and to form a second hard mask covering the ridge, the doped regions etched in step c) and the regions of the semiconductor layer outside of the space and etched in step c);

g) partially etching the first and second strips of the semiconductor layer left free by the second hard mask so as to define a slab on either side of the ridge and joined with the etched p-doped and n-doped regions thus forming the ridge pin junction; and h) removing the second hard mask, process in which the hard masks and resist masks formed in steps a) to d) are produced by photolithography.

2. The process according to claim 1, wherein steps b) to d) consist in succession in:

forming a first resist mask on the first hard mask and on the semiconductor layer, such that the first resist mask covers the space bounded between the two strips and is superposed on one of the strips while leaving free a first layer region defining the first implantation region;

implanting an n-type dopant into the first implantation region;

removing the first resist mask;

forming a second resist mask on the first hard mask and on the semiconductor layer, such that the second resist mask covers the space bounded between the two strips and is superposed on the other strip while leaving free a second layer region defining the second implantation region;

implanting a p-type dopant into the second implantation region;

removing the second resist mask;

forming a third resist mask on top of the first hard mask and on the semiconductor layer, such that the third resist mask covers the space bounded between the two strips, and thereby leaving free at least one portion of the two doped regions and the regions of the semiconductor layer outside the doped regions;

partially etching the layer through the third resist mask and the first hard mask;

removing the third resist mask;

forming a fourth resist mask on the first hard mask and on the semiconductor layer, such that the fourth resist mask is superposed on the strips of the first hard mask, on the etched outside regions and on the etched doped regions, while leaving the space bounded between them free;

partially etching the layer through the fourth resist mask and the first hard mask until the ridge height is obtained between the two strips of the first hard mask; and removing the fourth resist mask.

3. The process according to claim 2, wherein the third resist mask is formed such that it only covers the space bounded between the two strips, thus leaving the two p- and n-doped regions completely free.

4. The process according to claim 2, wherein the step of forming the third resist mask is such that it simultaneously covers the space bounded between the two strips, at least one external portion of the two p- and n-doped regions and one portion of the external regions of the thin intrinsic semiconductor layer adjacent each external portion, so that once produced in the successive etching step, the external portions define projections in the p- and n-doped regions of height equal to that of the ridge, the process comprising, after the step f) of CMP polishing:

a step of forming a fifth resist mask covering the projections in the p- and n-doped regions and the projections in the layer which are adjacent the projections in the doped regions which are not covered by the second hard mask, and superposed on the etched doped regions and on the etched outside regions of the layer; and a step of removing the fifth resist mask before step h) of removing the second hard mask.

5. The process according to claim 1, wherein the hard material deposited in step e) is the same as that forming the first hard mask.

6. The process according to claim 1, wherein the first and/or second hard mask(s) is(are) made of a hard material chosen from silica and silicon nitride.

7. The process according to claim 1, wherein the semiconductor layer is a thin silicon layer.

8. The process according to claim 1, wherein the semiconductor layer is made from a semiconductor other than silicon and is formed on the thin silicon layer.

9. The process according to claim 8, wherein the semiconductor layer is a thin germanium layer.

* * * * *